(12) United States Patent
Astley et al.

(10) Patent No.: US 10,727,361 B2
(45) Date of Patent: Jul. 28, 2020

(54) APPARATUS AND ASSOCIATED METHODS FOR REDUCING NOISE IN PHOTODETECTORS

(71) Applicant: EMBERION OY, Espoo (FI)

(72) Inventors: Michael Robert Astley, Waterbeach (GB); Alan Colli, Cambridge (GB)

(73) Assignee: EMBERION OY, Espoo (FI)

( * ) Notice: Subject to any disclaimer, the term of this patent is extended or adjusted under 35 U.S.C. 154(b) by 92 days.

(21) Appl. No.: 16/096,954

(22) PCT Filed: Apr. 25, 2017

(86) PCT No.: PCT/FI2017/050311
§ 371 (c)(1),
(2) Date: Oct. 26, 2018

(87) PCT Pub. No.: WO2017/187015
PCT Pub. Date: Nov. 2, 2017

(65) Prior Publication Data
US 2019/0123223 A1   Apr. 25, 2019

(30) Foreign Application Priority Data
Apr. 27, 2016   (EP) .................................... 16167252

(51) Int. Cl.
*H01L 31/112* (2006.01)
*H01L 31/0352* (2006.01)
(Continued)

(52) U.S. Cl.
CPC ........ *H01L 31/035218* (2013.01); *G01J 1/44* (2013.01); *H01L 31/028* (2013.01);
(Continued)

(58) Field of Classification Search
CPC ....................... H01L 31/112; H01L 31/035218
See application file for complete search history.

(56) References Cited

U.S. PATENT DOCUMENTS

2016/0005894 A1* 1/2016 Zhang .................... B82Y 40/00
257/29

FOREIGN PATENT DOCUMENTS

CN   103943713 A   7/2014
EP   2 079 162 A1   7/2009

OTHER PUBLICATIONS

European Search Report dated Jan. 4, 2017, corresponding to European Patent Application No. 16167252.
(Continued)

*Primary Examiner* — Thanh Luu
(74) *Attorney, Agent, or Firm* — Squire Patton Boggs (US) LLP

(57) ABSTRACT

An apparatus configured to alternate the application of first and second gate voltages to a gate electrode of a photodetector. A first change in electrical current is relative to a predetermined measurement of electrical current taken at the first gate voltage in the absence of incident electromagnetic radiation, and a second change in electrical current is relative to a predetermined measurement of electrical current taken at the second gate voltage in the absence of the incident electromagnetic radiation. The photodetector comprises a channel, and source and drain electrodes configured to enable flow of electrical current through the channel. Quantum dots are configured to generate charge carriers on exposure to the incident electromagnetic radiation. The gate electrode is configured to generate an electric field upon the application of a gate voltage thereto, and process the signal to at least partially remove any changes in electrical current which are attributed to noise.

12 Claims, 5 Drawing Sheets

(51) Int. Cl.
  H01L 31/02    (2006.01)
  G01J 1/44     (2006.01)
  H01L 31/028   (2006.01)
  H01L 31/032   (2006.01)
  H01L 31/113   (2006.01)
(52) U.S. Cl.
  CPC ...... *H01L 31/02019* (2013.01); *H01L 31/032* (2013.01); *H01L 31/035209* (2013.01); *H01L 31/112* (2013.01); *H01L 31/1136* (2013.01); *G01J 2001/4473* (2013.01)

(56) References Cited

OTHER PUBLICATIONS

International Search Report and Written Opinion dated Oct. 5, 2017 corresponding to International Patent Application No. PCT/FI2017/050311.

Klumperink, et al., "Reducing MOSFET 1/f Noise and Power Comsumption by Switched Biasing", IEEE Journal of Solid-State Circuits, vol. 35, No. 7, Jul. 1, 2000, pp. 994-1001.

Konstantatos, et al., "Hybrid graphene-quantum dot phototransistors with ultrahigh gain", Nature Nanotechnology, vol. 7, No. 6, May 6, 2012, pp. 1-6.

Bloom, et al., "1/f noise reduction of metal-oxide-semiconductor transistors by cycling from inversion to accumulation", Applied Physics Letters, vol. 58, No. 15, Apr. 15, 1991, pp. 1664-1666.

Kardynal, et al., "Low-noise photon counting with a radio-frequency quantum-dot field-effect transistor", Applied Physics Letters, vol. 84, No. 3, Jan. 19, 2004, pp. 419-421.

Enz, et al., "Recent Trends in Low-frequency Noise Reduction Techniques for Integrated Circuits", International Conference on Noise and Fluctuations (ICNF), Jun. 1, 2015, pp. 1-6.

Stolyarov, et al., "Suppression of 1/f noise in near-ballistic h-BN-graphene-h-BN heterostructure field-effect transistors", Applied Physics Letters, vol. 107, No. 2, Jul. 13, 2015, pp. 1-5.

\* cited by examiner

Figure 7

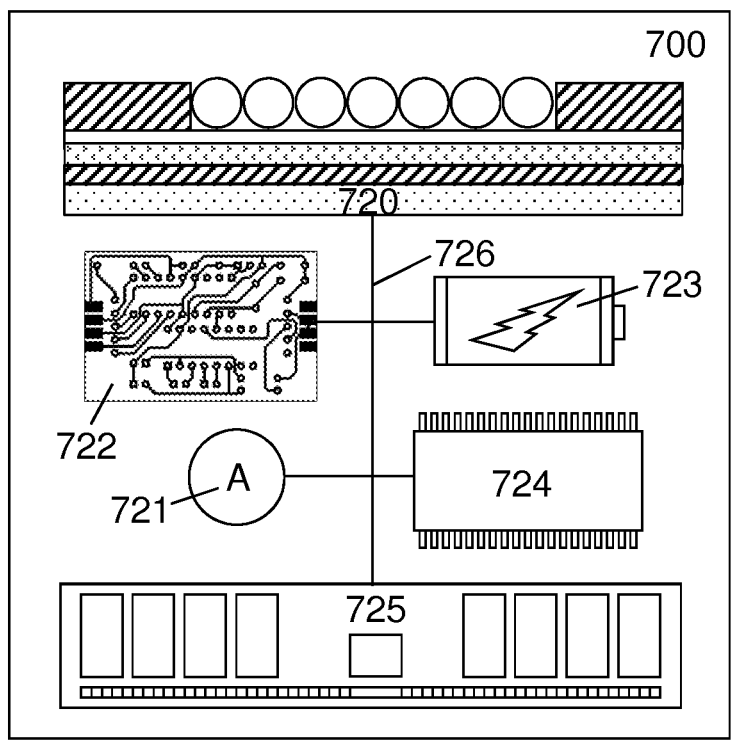

Figure 8

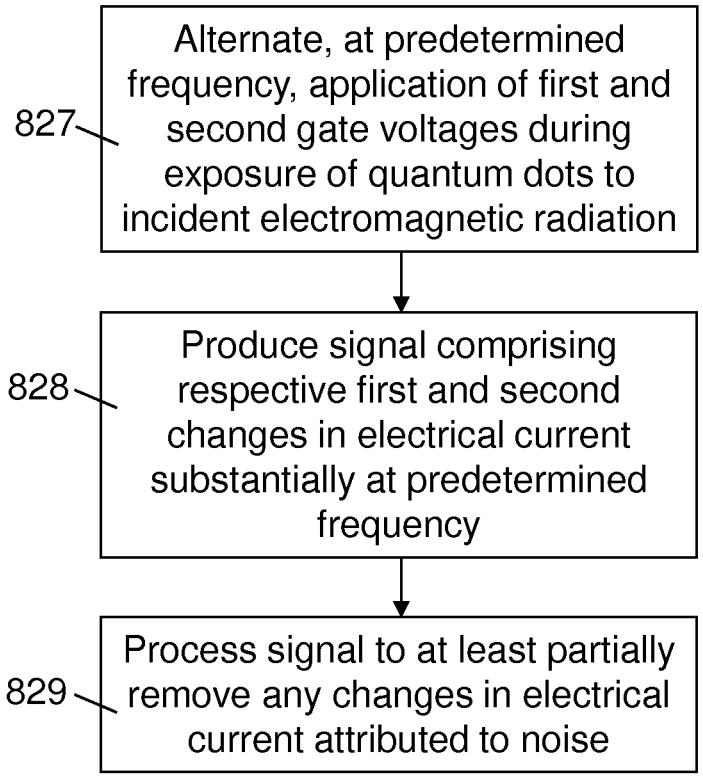

827 — Alternate, at predetermined frequency, application of first and second gate voltages during exposure of quantum dots to incident electromagnetic radiation 828 — Produce signal comprising respective first and second changes in electrical current substantially at predetermined frequency 829 — Process signal to at least partially remove any changes in electrical current attributed to noise

Figure 9

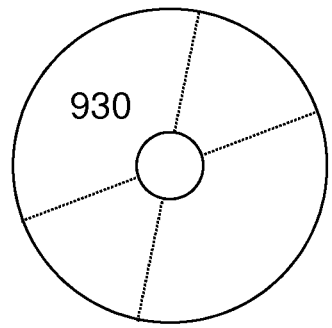

APPARATUS AND ASSOCIATED METHODS FOR REDUCING NOISE IN PHOTODETECTORS

TECHNICAL FIELD

The present disclosure relates particularly to photodetectors, associated methods and apparatus. Certain embodiments specifically concern an apparatus configured to alternate, at a predetermined frequency, the application of first and second gate voltages to a gate electrode of a photodetector during exposure of a plurality of quantum dots of the photodetector to incident electromagnetic radiation to produce a signal comprising respective first and second changes in electrical current substantially at the predetermined frequency, and process the signal to at least partially remove any changes in electrical current which are attributed to noise such that the resulting processed signal is indicative of one or more of the presence and magnitude of the incident electromagnetic radiation.

Some embodiments may relate to portable electronic devices, in particular, so-called hand-portable electronic devices which may be hand-held in use (although they may be placed in a cradle in use). Such hand-portable electronic devices include so-called Personal Digital Assistants (PDAs) and tablet PCs. The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to reduce noise in field-effect transistors.

The listing or discussion of a prior-published document or any background in this specification should not necessarily be taken as an acknowledgement that the document or background is part of the state of the art or is common general knowledge.

SUMMARY

According to a first aspect, there is provided an apparatus configured to:

alternate, at a predetermined frequency, the application of first and second gate voltages to a gate electrode of a photodetector during exposure of a plurality of quantum dots of the photodetector to incident electromagnetic radiation to produce a signal comprising respective first and second changes in electrical current substantially at the predetermined frequency, wherein the first change in electrical current is relative to a predetermined measurement of electrical current taken at the first gate voltage in the absence of the incident electromagnetic radiation, and the second change in electrical current is relative to a predetermined measurement of electrical current taken at the second gate voltage in the absence of the incident electromagnetic radiation, the photodetector comprising a channel, and source and drain electrodes configured to enable a flow of electrical current through the channel between the source and drain electrodes, the quantum dots configured to generate charge carriers on exposure to the incident electromagnetic radiation to cause a detectable change in the electrical current flowing through the channel, the gate electrode configured to generate an electric field upon the application of a gate voltage thereto to tune the detectable change in electrical current; and process the signal to at least partially remove any changes in electrical current which are attributed to noise such that the resulting processed signal is indicative of one or more of the presence and magnitude of the incident electromagnetic radiation.

The apparatus may be configured to process the signal by subtracting the first change in electrical current from the second change in electrical current such that any changes in electrical current which are attributed to noise correlated between the first and second changes in electrical current are substantially removed.

The apparatus may be configured to process the signal by:
  multiplying the signal by a reference signal having the predetermined frequency to produce an intermediate signal; and
  passing the intermediate signal through a low-pass filter to substantially remove any changes in electrical current which are attributed to noise at frequencies other than the predetermined frequency.

The predetermined frequency at which the first and second gate voltages are alternated may be greater than the frequency of trapped charge state fluctuations in the vicinity of the channel such that any changes in electrical current which are attributed to flicker noise caused by the trapped charge state fluctuations are substantially removed.

The predetermined frequency at which the first and second gate voltages are alternated may be at least 500 Hz (e.g. 500 Hz–10 kHz).

The first and second gate voltages may be sufficiently large in magnitude to reset the trapped charge states to an initial condition (e.g. ±50-100V).

The first and second gate voltages may be set such that the associated electric fields enable the transfer of different types of charge carrier to the channel leaving the remaining type of charge carrier on the quantum dots to produce the respective first and second changes in electrical current (e.g. ±1-50V).

The first and second gate voltages may be set such that the associated electric fields cause the channel to become electrostatically doped with opposing polarities to produce the respective first and second changes in electrical current (e.g. ±50-100V).

The channel may comprise a conductive or semi-conductive two-dimensional material.

The conductive or semi-conductive two-dimensional material may comprise one or more of graphene, reduced graphene oxide, a graphene-like material, and a transition metal dichalcogenide.

The graphene-like material may comprise one or more of phosphorene, silicene, germanene, stanene, GaN, InN, InP, InAs, BAs and GaP.

The transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$, $PtX_2$, where X=S, Se or Te.

The plurality of quantum dots may comprise one or more of PbS, CdSe, CdS, PbSe, ZnO, ZnS, CZTS, Cu$_2$S, Bi$_2$S$_3$, Ag$_2$S, Ag$_2$S, HgTe, CdHgTe, InAs, InSb, Ge and CIS.

The source, drain and gate electrodes may comprise one or more of a metal, a metal nanoparticle ink, silver, gold, copper, nickel, cobalt, a conductive metal oxide, a carbon-based material, an organic material and a polymer.

One or more of the material, size and shape of the quantum dots may be configured such that the electron-hole pairs are generated on exposure to at least one of the following types of electromagnetic radiation: x-rays, visible light, infrared, ultraviolet, radio waves, microwaves, gamma rays and thermal radiation.

The incident electromagnetic radiation may comprise direct (e.g. transmitted from the source directly to the apparatus) or indirect (e.g. reflected or refracted onto the apparatus by another object) electromagnetic radiation which is incident on the plurality of quantum dots.

The apparatus may comprise a processor and memory including computer program code, the memory and computer program code configured to, with the processor, enable the apparatus to at least perform the steps of any method described herein.

The apparatus may comprise circuitry configured to enable the apparatus to at least perform the steps of any method described herein.

The photodetector may form part of the apparatus.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, and a module for one or more of the same.

According to a further aspect, there is provided a method comprising:
  alternating, at a predetermined frequency, the application of first and second gate voltages to a gate electrode of a photodetector during exposure of a plurality of quantum dots of the photodetector to incident electromagnetic radiation to produce a signal comprising respective first and second changes in electrical current substantially at the predetermined frequency, wherein the first change in electrical current is relative to a predetermined measurement of electrical current taken at the first gate voltage in the absence of the incident electromagnetic radiation, and the second change in electrical current is relative to a predetermined measurement of electrical current taken at the second gate voltage in the absence of the incident electromagnetic radiation, the photodetector comprising a channel, and source and drain electrodes configured to enable a flow of electrical current through the channel between the source and drain electrodes, the quantum dots configured to generate charge carriers on exposure to the incident electromagnetic radiation to cause a detectable change in the electrical current flowing through the channel, the gate electrode configured to generate an electric field upon the application of a gate voltage thereto to tune the detectable change in electrical current; and
  processing the signal to at least partially remove any changes in electrical current which are attributed to noise such that the resulting processed signal is indicative of one or more of the presence and magnitude of the incident electromagnetic radiation.

The steps of any method disclosed herein do not have to be performed in the exact order disclosed, unless explicitly stated or understood by the skilled person.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

FIG. 7 shows another apparatus comprising a quantum dot field effect transistor;

FIG. 8 shows a method of detecting incident electromagnetic radiation; and

FIG. 9 shows a computer-readable medium comprising a computer program configured to perform, control or enable a method described herein.

DESCRIPTION OF SPECIFIC ASPECTS/EMBODIMENTS

Figure 1:
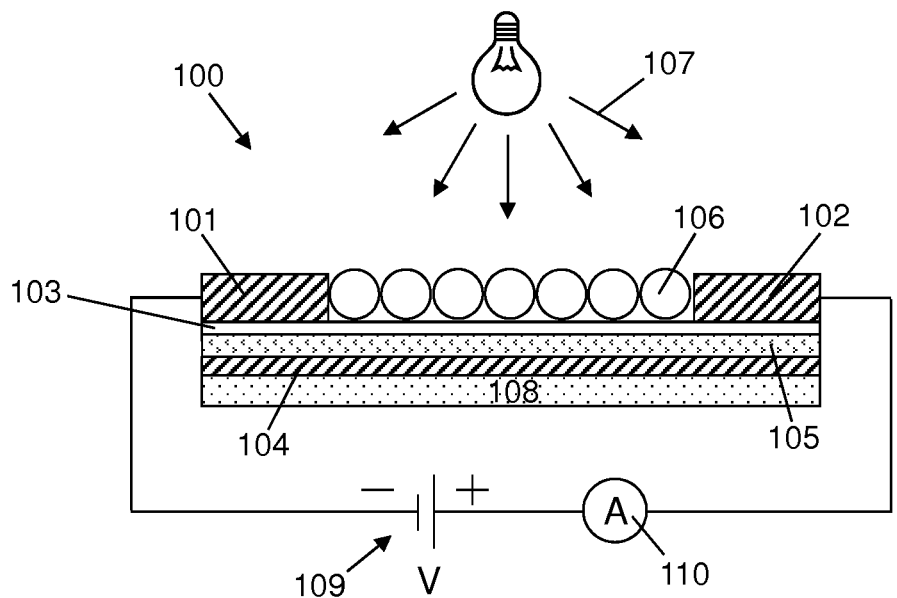
FIG. 1 shows a photodetector comprising a quantum dot field effect transistor.

FIG. 1 shows a photodetector 100 comprising a quantum dot field-effect transistor. Field-effect transistors normally comprise source 101 and drain 102 electrodes configured to enable a flow of electrical current through a channel 103 between the source 101 and drain 102 electrodes (i.e. the source-drain current), and a gate electrode 104 which is separated from the channel 103 by a dielectric material 105 and is configured to vary the electrical current flowing through the channel 103 when a voltage is applied thereto. To enable photodetection, however, the gate electrode 104 is replaced (or supplemented) by a plurality of quantum dots 106 configured to cause a detectable change in the electrical current on exposure to incident electromagnetic radiation 107 which is indicative of one or more of the presence and magnitude of the incident electromagnetic radiation 107.

The quantum dots 106 are formed on top of the channel 103, which itself is supported on a substrate 108. The quantum dots 106 are configured to generate electron-hole pairs on exposure to the incident electromagnetic radiation 107. The photodetector 100 is configured such that, after the generation of these electron-hole pairs, either the electrons or the holes are transferred to the channel 103 leaving the remaining charge carriers on the quantum dots 106. These remaining charge carriers then gate the channel 103 causing a detectable change in the current flowing therethrough.

The photodetector 100 also comprises a power supply 109 configured to apply a potential difference V between the source 101 and drain 102 electrodes, and an ammeter 110 configured to measure the electrical current flowing through the channel 103.

Photodetectors 100 comprising quantum dot field-effect transistors typically exhibit excellent responsivity to the incident electromagnetic radiation 107, even at relatively low levels of intensity. However, the noise equivalent power of such photodetectors 100 is strongly affected by flicker noise, which is thought to be caused by fluctuations of trapped charge states in the vicinity of the channel 103 (e.g. from electrostatic interactions between the channel 103 and the underlying layers of material 104, 105, 108).

Figure 2:
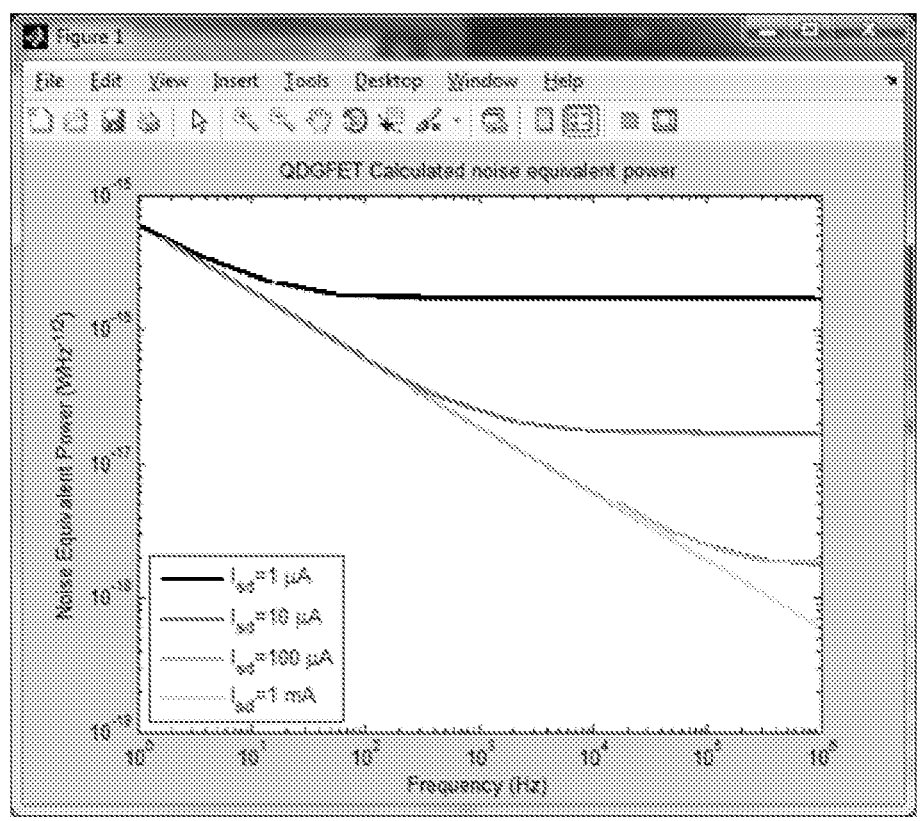
FIG. 2 shows the simulated noise equivalent power of a quantum dot field effect transistor at different source-drain currents.

FIG. 2 shows the calculated noise equivalent power of a quantum dot field-effect transistor for different source-drain currents $I_{sd}$. The noise equivalent power represents the minimum optical power (i.e. the amount of incident light) required for a signal-to-noise ratio of 1. As is evident from this figure, flicker noise is inversely proportional to the frequency of the signal, and is therefore sometimes referred to as low frequency, 1/f or "pink" noise. Existing efforts to reduce flicker noise in field-effect transistors have so far concentrated on ways to reduce the physical origins of the trapped charge state fluctuations themselves, e.g. by reducing the temperature, changing the contact geometry or by encapsulating the channel.

There will now be described an apparatus and associated methods that may reduce flicker noise without necessarily reducing the trapped charge state fluctuations. The present approach comprises alternating, at a predetermined frequency, the application of first and second gate voltages to the gate electrode during exposure of the quantum dots to the incident electromagnetic radiation to produce a signal comprising respective first and second changes in electrical current substantially at the predetermined frequency. The first change in electrical current is relative to a predetermined measurement of electrical current taken at the first gate voltage in the absence of the incident electromagnetic radiation, and the second change in electrical current is relative to a predetermined measurement of electrical current taken at the second gate voltage in the absence of the incident electromagnetic radiation. The signal is then processed to at least partially remove any changes in electrical current which are attributed to noise such that the resulting processed signal is indicative of one or more of the presence and magnitude of the incident electromagnetic radiation. The apparatus and methods described herein may also be used to reduce other types of noise in the signal depending on the predetermined frequency at which the gate voltage is varied.

Figure 3:
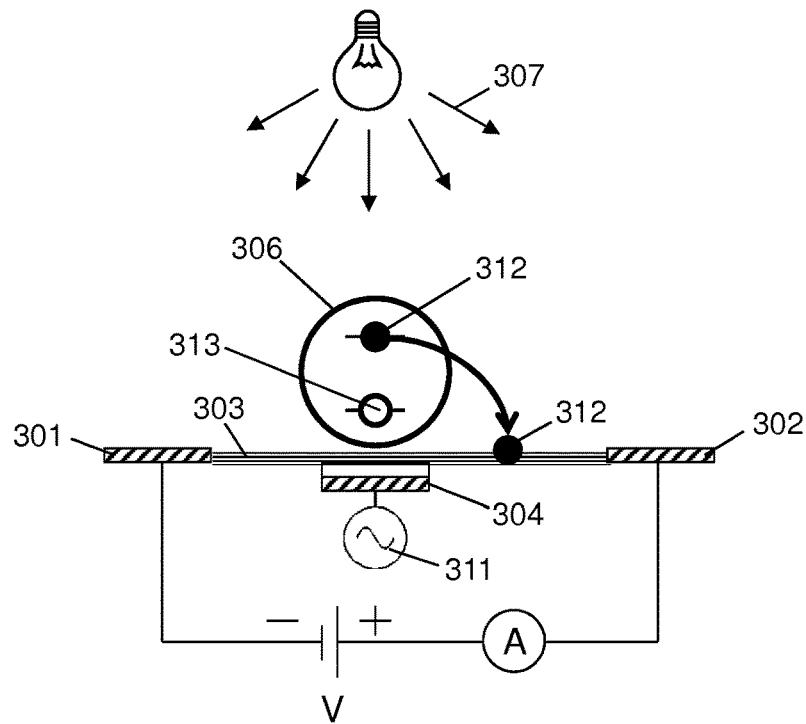
FIG. 3 shows how a gate electrode can be used to control the optoelectronic response of a quantum dot field effect transistor.

FIG. 3 shows how a gate electrode 304 can be used to control the optoelectronic response of a quantum dot field-effect transistor. When a voltage 311 is applied to the gate electrode 304, an electric field is produced by the gate electrode 304 which can (depending on its strength, e.g. up to $10^8$ V/m) change the band-alignment between the channel 303 and the quantum dot 306. This change in band-alignment influences whether an electron 312 or hole 313 of the photo-generated electron-hole pair is transferred to the channel 303. For example, if a first voltage is applied to the gate electrode 304, the resulting electric field may enable the transfer of an electron 312 from the quantum dot 306 to the channel 303. Similarly, if a second voltage is applied to the gate electrode 304, the resulting electric field may enable the transfer of a hole 313 from the quantum dot 306 to the channel 303. Based on a typical dielectric thickness of 10-100 nm, the gate voltages may be in the range of ±1-50V.

When the channel 303 is p-doped and the applied voltage 311 enables the transfer of an electron 312 from the quantum dot 306 to the channel 303, the remaining hole 313 on the quantum dot 306 creates a depletion region in the channel 303 causing a decrease in the electrical current flowing therethrough. On the other hand, when the applied voltage 311 enables the transfer of a hole 313 from the quantum dot 306 to the channel 303, the remaining electron 312 on the quantum dot 306 creates a conductive region in the channel 303 causing an increase in the electrical current flowing therethrough.

When the channel 303 is n-doped and the applied voltage 311 enables the transfer of an electron 312 from the quantum dot 306 to the channel 303, the remaining hole 313 on the quantum dot 306 creates a conductive region in the channel 303 causing an increase in the electrical current flowing therethrough. On the other hand, when the applied voltage 311 enables the transfer of a hole 313 from the quantum dot 306 to the channel 303, the remaining electron 312 on the quantum dot 306 creates a depletion region in the channel 303 causing a decrease in the electrical current flowing therethrough.

Depending on its strength (e.g. $10^8$-$10^9$ V/m), the electric field generated by the gate electrode 304 can cause electrostatic doping of the channel 303 instead of changes in the band-alignment between the channel 303 and the quantum dot 306. For example, a positive gate voltage 311 may enable the transfer of a hole 313 from an un-doped channel 303 to the quantum dot 306 leaving an electron 312 in the channel 303 (i.e. n-doped channel), whilst a negative gate voltage 311 may enable the transfer of an electron 312 from an un-doped channel 303 to the quantum dot 306 leaving a hole 313 in the channel 303 (i.e. p-doped channel). In this scenario, the doping of the channel 303 may be used to dictate whether the incident electromagnetic radiation 307 causes an increase or decrease in the electrical current rather than the band-alignment between the channel 303 and the quantum dot 306. Based on a typical dielectric thickness of 10-100 nm, the gate voltages may be in the range of ±50-100V.

Figure 4:
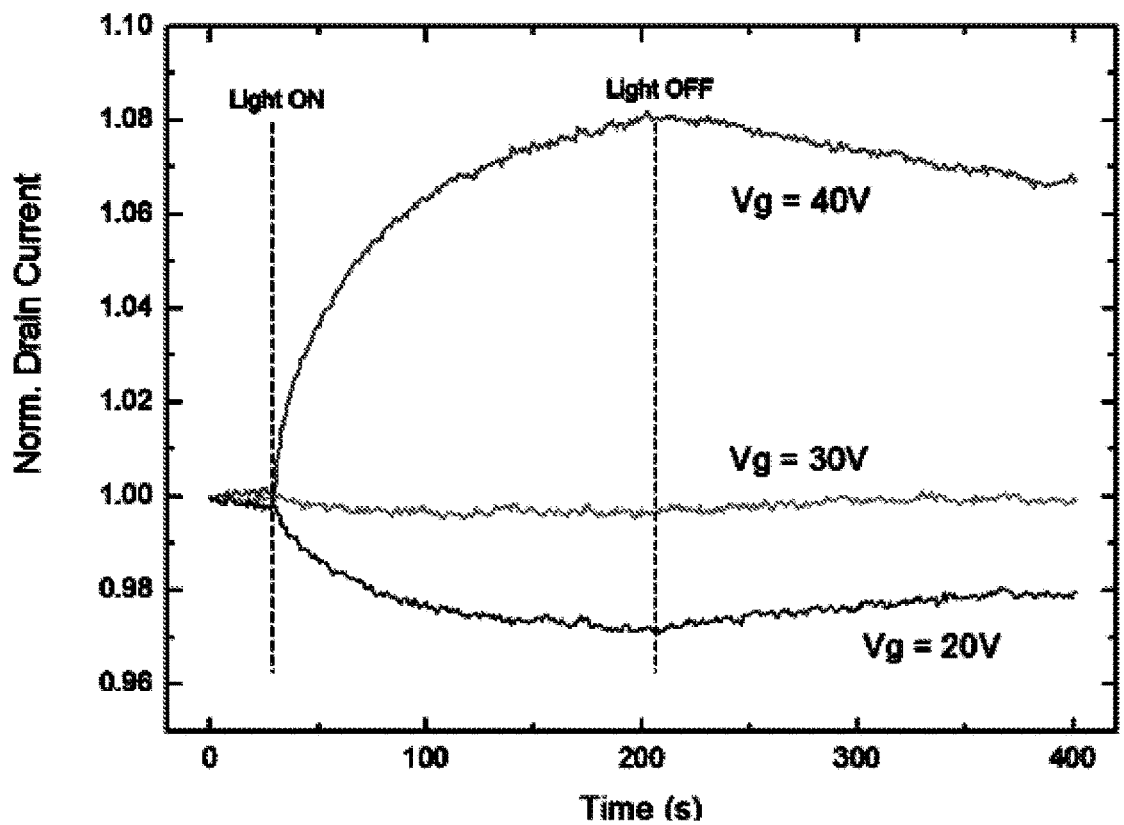
FIG. 4 shows how the source-drain current varies with applied gate voltage.

FIG. 4 shows how the source-drain current flowing through a p-doped graphene channel varied with applied gate voltage. In this experiment, the gate voltage was varied from 20V to 30V and then to 40V causing corresponding changes in the band-alignment between the channel and quantum dots. When a voltage of 20V was applied to the gate electrode, the band-alignment resulted in the transfer of electrons to the channel, and the remaining holes in the quantum dots caused a decrease in the source-drain current (i.e. a negative optoelectronic response). When the voltage was increased to 30V, the band-alignment flattened to allow the transfer of equal numbers of electrons and holes per unit time resulting in no net change in the source-drain current (i.e. zero optoelectronic response). When the voltage was then increased further to 40V, the band-alignment resulted in the transfer of holes to the channel, and the remaining electrons in the quantum dots caused an increase in the source-drain current (i.e. a positive optoelectronic response). These experimental results demonstrate that the response of a photodetector can not only be switched off by varying the gate voltage (e.g. from 20V to 30V in this example), but can even be reversed (e.g. from 20V to 40V in this example).

As mentioned above, rather than trying to reduce trapped charge state fluctuations in the vicinity of the channel, the present approach involves modulating the response of the photodetector by applying a time-varying voltage to the gate electrode followed by signal processing to reduce flicker noise in the photodetector signal. A simulation has been performed to demonstrate this technique. The source-drain current $I_{SD}$ flowing through the channel of a quantum dot field-effect transistor is given by:

$$I_{SD} = nq_e \mu V_{SD} \frac{w}{l} \quad \text{Equation 1}$$

where $q_e$ is the electron charge, $\mu$ is the channel carrier mobility, $V_{SD}$ is the source-drain bias voltage, $$\frac{w}{l}$$

is the width-to-length aspect ratio of the channel, and n is the charge carrier density. The charge carrier density is given by:

$$n = n_0 + n_{light} + n_{noise} \quad \text{Equation 2}$$

where $n_0$ is the background carrier density, $n_{light}$ is the additional carrier density induced by the incident electromagnetic radiation and $n_{noise}$ is the carrier density modulation due to fluctuating trapped charge states. The power spectral density of $n_{noise}$ is typically proportional to $$\frac{1}{f^\alpha},$$

where f is the frequency of measurement and a is a constant parameter approximately equal to one which causes the 1/f noise seen in real-world devices.

Equation 1 was simulated in MATLAB™ for two different gate voltages. It was assumed in these simulations that varying the gate voltage caused a change in the background carrier density (i.e. electrostatic doping of the channel) and reversal of the light-induced carrier density (i.e. switching between the transfer of electrons and holes). It was also assumed that the trapped charge states were unaffected by the gate voltages (and therefore gave rise to flicker noise at both voltages), and that thermal noise due to the resistance of the channel was also present.

To simulate a typical data capture sequence, the application of first $V_{G1}$ (20V) and second $V_{G2}$ (40V) gate voltages was alternated every millisecond (i.e. at a predetermined frequency of 1 kHz) during exposure of the quantum dots to the incident electromagnetic radiation, and the corresponding source-drain currents $I_{SD}$ were measured. The source-drain current for each gate voltage was then compared with a predetermined dark-level measurement (i.e. without the incident electromagnetic radiation) taken at the same gate voltage to determine the change in source-drain current $\Delta I_{SD}$ caused by the incident electromagnetic radiation. The resulting signal therefore comprises first and second changes in source-drain current at the predetermined frequency corresponding to the first $V_{G1}$ and second $V_{G2}$ gate voltages.

Figure 5A:
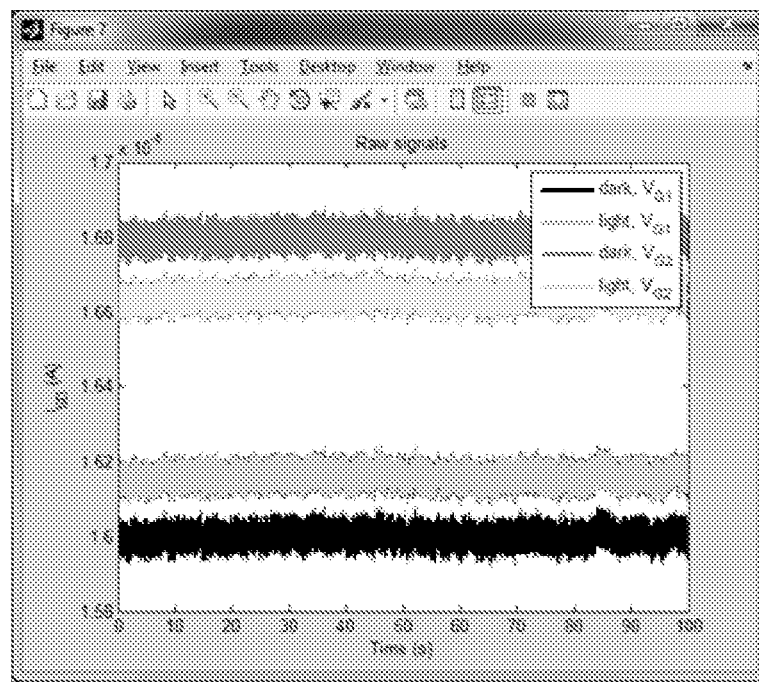
FIG. 5a shows the source-drain current with and without illumination for two different gate voltages.
Figure 5B:
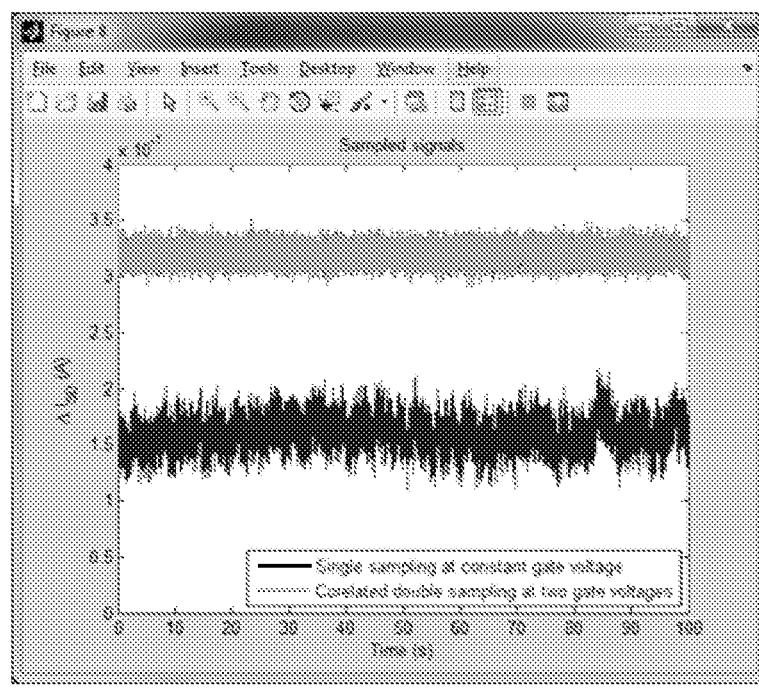
FIG. 5b shows the change in source-drain current caused by the electromagnetic radiation for one of the gate voltages and a corresponding difference signal for the two different gate voltages.

FIG. 5a shows the source-drain current $I_{SD}$ measured with (light) and without (dark) the incident electromagnetic radiation for the two different gate voltages $V_{G1}$ and $V_{G2}$, and FIG. 5b shows the change in source-drain current $\Delta I_{sp}$ for gate voltage $V_{G1}$ (bottom trace). One way of processing the signal to at least partially remove any changes in source-drain current which are attributed to noise is to use correlated double sampling. This is achieved by subtracting the first change in source-drain current from the second change in source-drain current to produce a difference signal. The trapped charge states typically have lifetimes of more than two milliseconds. Provided that the predetermined frequency at which the first $V_{G1}$ and second $V_{G2}$ gate voltages are alternated (1 kHz in this simulation) is greater than the frequency of the trapped charge state fluctuations (less than 500 Hz), the flicker noise will be correlated between the first and second changes in source-drain current. In this way, any changes in source-drain current which are attributed to flicker noise are substantially removed by subtracting the first and second changes in source-drain current from one another.

Figure 5C:
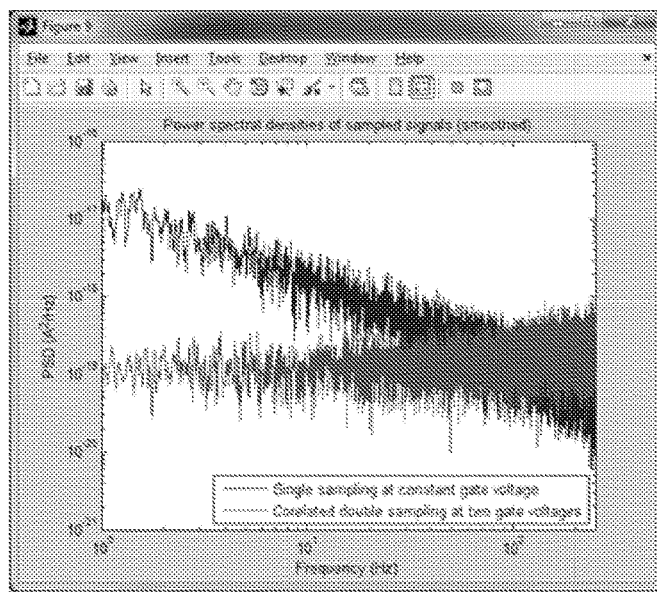
FIG. 5c shows the power spectral densities of the signals shown in FIG. 5b.

FIG. 5b shows the difference signal calculated by subtracting the change in source-drain current for the two different gate voltages $V_{G1}$ and $V_{G2}$ (top trace), and FIG. 5c shows the power spectral densities of the signals in FIG. 5b. By comparing the difference signal with the change in source-drain current for the first gate voltage $V_{G1}$ (bottom trace in FIG. 5b), it can be seen the difference signal shows significantly less flicker noise. This is confirmed by FIG. 5c which shows reduced levels of flicker noise at lower frequencies relative to the signal for the single gate voltage. Furthermore, the power spectral density of the difference signal shows that the level of noise is substantially constant at all frequencies. In other words, the "pink" 1/f noise has been converted to "white" noise, which can be more easily removed (e.g. by filtering).

Another way of processing the signal to at least partially remove any changes in source-drain current which are attributed to noise is to use a lock-in measurement. The lock-in technique is based on the concept of phase-sensitive detection, which refers to the demodulation or rectification of an AC signal by a circuit which is controlled by a reference waveform derived from the device which caused the signal to be modulated. A phase-sensitive detector effectively responds to signals which are coherent (i.e. same frequency and phase) with the reference waveform and rejects all others. In a light measurement system the reference signal is usually an output coherent with the chopping action provided by a chopper, and the AC signal is the output from the photodetector.

Figure 6:
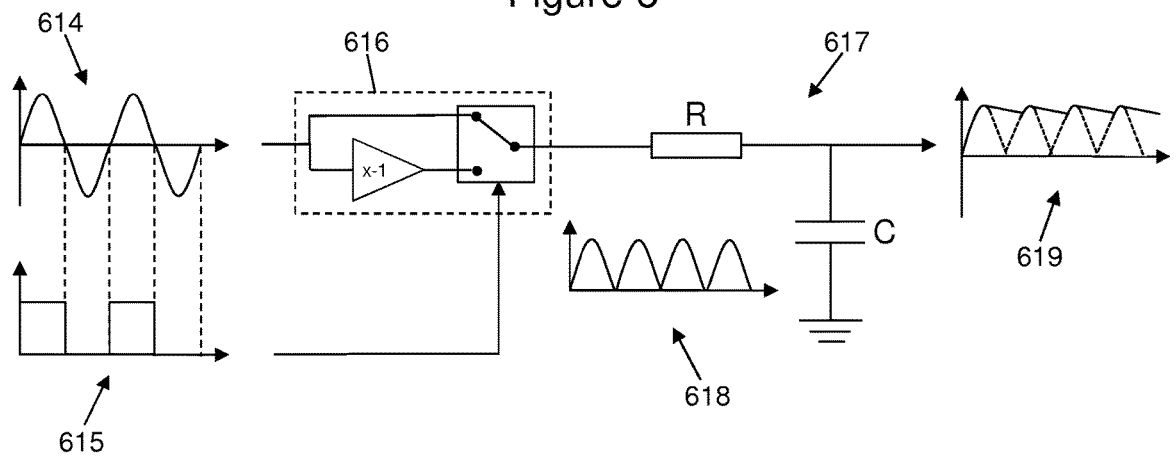
FIG. 6 shows how a lock-in measurement can be used to reduce noise in the signal.

FIG. 6 shows how a lock-in measurement can be used to reduce noise in an optical signal. In this example, the output from the photodetector is a sinusoidal signal 614 and the reference signal 615 is a square waveform. As can be seen, the reference signal 615 is used to control the switch of a multiplier 616 which opens and closes according to the square waveform 615 to output certain portions of the photodetector signal 614 or an inverted version of it. When the magnitude of the reference signal 615 is high, the switch of the multiplier 616 is in the "up" position and a positive portion of the photodetector signal 614 is output. When the magnitude of the reference signal 615 is low, the switch of the multiplier 616 is in the "down" position and a positive portion of the inverted signal is output. Rectification 618 of the signal 614 occurs when the reference waveform 615 controlling the switch is exactly in phase with the photodetector signal 614. The output of the multiplier 616 is connected to a low-pass filter 617 which, in this example, consists of a resistor (R) and a capacitor (C). In this way, noise associated with the signal 614 passes through un-rectified to the low-pass RC filter 617 where it is smoothed or averaged to its mean value of zero.

If both the signal 614 and reference 615 waveforms are sinusoidal, then the output of the multiplier 616 will contain components at frequencies of $f_s+f_r$ and $f_s-f_r$, where $f_s$ and $f_r$ are the frequencies of the signal 614 and reference 615 waveforms respectively. If the frequencies of the signal 614 and reference 615 waveforms are the same (as is the case where the reference waveform 615 is derived from the device which is modulating the signal 614), then there will be an output at 0 Hz (i.e. DC). Any other component in the signal 614 (e.g. a noise component at a frequency of $f_n$) will give rise to an AC output at frequencies of $f_n+f_r$ and $f_n-f_r$, which will be smoothed or averaged to the mean value of zero by the low pass filter 617.

In the present case, the photodetector signal 614 is modulated by the alternating gate voltage rather than by a chopper. This means that even under constant illumination, the output 614 from the photodetector is modulated at the predetermined frequency of the gate voltage. Using the lock-in technique illustrated in FIG. 6, therefore, the multiplier 616 multiplies the photodetector signal 614 by a reference signal 615 having the predetermined frequency to produce an intermediate (rectified) signal 618, and the low-pass filter 617 substantially removes any changes in source-drain current which are attributed to noise at frequencies other than the predetermined frequency. In this way, only those trapped charge states which fluctuate at a narrow frequency range around the reference frequency will remain in the signal.

In the simulation described above, it was assumed that the trapped charge states were unaffected by the applied gate voltages. In other examples, however, the first and second gate voltages may be sufficiently large in magnitude to "reset" the trapped charge states to an initial condition (i.e. a charged or discharged state) each time the voltage is changed (e.g. ±50-100V). In this scenario, the flicker noise is reduced further because the trapped charge states are not given sufficient time to fluctuate over the course of the measurement, but are always in their initial condition.

Also, as mentioned previously, the applied gate voltages may influence the change in source-drain current by inverting the band-alignment between the channel and the quantum dots, or by electrostatically doping the channel. The particular mechanism involved is dependent upon the magnitude of the gate voltages and the particular materials used to form the channel and quantum dots. A further benefit of the band-alignment mechanism is that when the gate voltage switches, the charge carriers that are left on the quantum dots from the previous cycle are discharged into the channel more quickly than they would be if no gate voltage was applied (e.g. 100 µs-10 ms with gate voltage vs 100 ms-1 s without gate voltage). This increases the response speed of the photodetector to fast changes in illumination.

FIG. 7 shows another apparatus 700 comprising a quantum dot field effect transistor. The apparatus 700 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, and a module for one or more of the same. In the example shown, the apparatus 700 comprises a quantum dot field-effect transistor 720, an ammeter 721, processing circuitry 722, a power supply 723, a processor 724 and a storage medium 725, which are electrically connected to one another by a data bus 726.

As described previously, the field-effect transistor 720 comprises a channel; a plurality of quantum dots; and source, drain and gate electrodes. The channel may comprise a conductive or semi-conductive two-dimensional material such as graphene, reduced graphene oxide, a graphene-like material or a transition metal dichalcogenide. The graphene-like material may comprise one or more of phosphorene, silicene, germanene, stanene, GaN, InN, InP, InAs, BAs and GaP; and the transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$, where X=S, Se or Te.

One or more of the material, size and shape of the quantum dots may be configured such that the electron-hole pairs are generated on exposure to at least one of the following types of electromagnetic radiation: x-rays, visible light, infrared, ultraviolet, radio waves, microwaves, gamma rays and thermal radiation. In terms of material, the quantum dots may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

The source, drain and gate electrodes may comprise one or more of a metal, a metal nanoparticle ink, silver, gold, copper, nickel, cobalt, a conductive metal oxide, a carbon-based material, an organic material and a polymer.

The processor 724 is configured for general operation of the apparatus 700 by providing signalling to, and receiving signalling from, the other components to manage their operation. The storage medium 725 is configured to store computer code configured to perform, control or enable operation of the apparatus 700. The storage medium 725 may also be configured to store settings for the other components. The processor 724 may access the storage medium 725 to retrieve the component settings in order to manage the operation of the other components.

Under the control of the processor 724, the power supply 723 is configured to apply a voltage between the source and drain electrodes of the quantum dot field-effect transistor 720 to enable a flow of electrical current through the channel, and alternately apply, at a predetermined frequency, first and second gate voltages to produce a signal comprising respective first and second changes in electrical current substantially at the predetermined frequency.

The ammeter 721 is configured to measure the electrical current through the channel of the quantum dot field-effect transistor 720 so that any changes in current caused by the incident electromagnetic radiation can be determined.

One or more of the processor 724 and the processing circuitry 722 are configured to process the signal from the quantum dot field-effect transistor 720 to at least partially remove any changes in electrical current which are attributed to noise such that the resulting processed signal is indicative of one or more of the presence and magnitude of the incident electromagnetic radiation. For example, the processor 724 may be configured to reduce the noise by processing the signal using the above-mentioned correlated double sampling technique. Additionally or alternatively, the processing circuitry 722 may be configured to reduce the noise by processing the signal using the above-mentioned lock-in technique. To achieve the latter, the processing circuitry 722 may comprise the switch and low-pass filter described previously. In some cases, the processor 724 may form part of the processing circuitry 722.

Once the noise has been at least partially removed from the signal, the processor 724 may be configured to determine one or more of the presence and magnitude of the incident electromagnetic radiation based on the change in electrical current. In order to determine the presence/magnitude of the incident electromagnetic radiation, the processor 724 may use predetermined calibration data saved in the storage medium 725 which correlates the intensity of the electromagnetic radiation with the change in electrical current.

The processor 724 may be a microprocessor, including an Application Specific Integrated Circuit (ASIC). The storage medium 725 may be a temporary storage medium such as a volatile random access memory. On the other hand, the storage medium 725 may be a permanent storage medium such as a hard disk drive, a flash memory, or a non-volatile random access memory. The power supply 723 may comprise one or more of a mains supply, a primary battery, a secondary battery, a capacitor, a supercapacitor and a battery-capacitor hybrid.

FIG. 8 shows schematically the main steps 827-829 of a method of using the present apparatus. The method comprises: alternating, at a predetermined frequency, the application of first and second gate voltages to a gate electrode of a photodetector during exposure of a plurality of quantum dots of the photodetector to incident electromagnetic radiation 827; producing a signal comprising respective first and second changes in electrical current substantially at the predetermined frequency as a result of the first and second gate voltages 828; and processing the signal to at least partially remove any changes in electrical current which are attributed to noise such that the resulting processed signal is indicative of one or more of the presence and magnitude of the incident electromagnetic radiation 829.

FIG. 9 illustrates schematically a computer/processor readable medium 930 providing a computer program according to one embodiment. The computer program may comprise computer code configured to perform, control or enable one or more of the method steps 827-829 of FIG. 8. In this example, the computer/processor readable medium 930 is a disc such as a digital versatile disc (DVD) or a compact disc (CD). In other embodiments, the computer/processor readable medium 930 may be any medium that has been programmed in such a way as to carry out an inventive function. The computer/processor readable medium 930 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A photodetector comprising a quantum dot field-effect transistor, wherein the quantum dot field-effect transistor comprises:
   source and drain electrodes configured to enable a flow of electrical current through a channel between the source and drain electrodes;
   a gate electrode which is separated from the channel by a dielectric material and is configured to vary the electrical current flowing through the channel when a voltage is applied thereto; and
   a plurality of quantum dots on top of the channel, configured to generate electron-hole pairs on exposure to incident electromagnetic radiation,
   wherein the source, drain and gate electrodes, the dielectric material and the channel are supported on a substrate,
   and wherein the photodetector further comprises
   a power supply configured to apply a potential difference between the source and drain electrodes, and an ammeter configured to measure the electrical current flowing through the channel
   wherein the power supply is also configured to alternately apply, at a predetermined frequency, first and second gate voltages to the gate electrode to produce a signal comprising respective first and second changes in the electrical current substantially at the predetermined frequency.

2. The photodetector according to claim 1, wherein the predetermined frequency at which the first and second gate voltages are alternated is in a range 500 Hz-10 kHz.

3. The photodetector according to claim 1, wherein the first and second gate voltages are in a range ±50-100V.

4. The photodetector according to claim 1, wherein the first and second gate voltages are in a range ±1-50V.

5. The photodetector according to claim 1, wherein the channel comprises a conductive or semi-conductive two-dimensional material comprising one or more of graphene, reduced graphene oxide, a graphene-like material, and a transition metal dichalcogenide.

6. A method for reducing noise in a photodetector comprising a quantum dot field-effect transistor with:
   source and drain electrodes configured to enable a flow of electrical current through a channel between the source and drain electrodes,
   a gate electrode which is separated from the channel by a dielectric material and is configured to vary the electrical current flowing through the channel when a voltage is applied thereto,
   and a plurality of quantum dots on top of the channel, configured to generate electron-hole pairs on exposure to incident electromagnetic radiation,
   wherein the method comprises:
   alternating, at a predetermined frequency, application of first and second gate voltages to a gate electrode of the field-effect transistor during exposure of a plurality of quantum dots in the photodetector to incident electromagnetic radiation, to produce a signal comprising respective first and second changes in the electrical current substantially at the predetermined frequency, wherein the first change in the electrical current is relative to a predetermined measurement of electrical current taken at the first gate voltage in an absence of the incident electromagnetic radiation, and the second change in the electrical current is relative to a predetermined measurement of electrical current taken at the second gate voltage in an absence of the incident electromagnetic radiation, and
   processing the signal to at least partially remove any changes in the electrical current which are attributed to noise, so that a resulting processed signal is indicative of one or more of presence and magnitude of the incident electromagnetic radiation.

7. The method according to claim 6, wherein the signal is processed by subtracting the first change in the electrical current from the second change in the electrical current, so that any changes in the electrical current which are attributed to noise correlated between the first and second changes in the electrical current are substantially removed.

8. The method according to claim 6, wherein the signal is processed by:
   multiplying the signal by a reference signal having the predetermined frequency to produce an intermediate signal; and
   passing the intermediate signal through a low-pass filter to substantially remove any changes in electrical current which are attributed to noise at frequencies other than the predetermined frequency.

9. The method according to claim 6, wherein the predetermined frequency at which the first and second gate voltages are alternated is in a range 500 Hz-10 kHz.

10. The method according to claim 6, wherein the first and second gate voltages are in a range ±50-100V.

11. The method according to claim 6, wherein the first and second gate voltages are in a range ±1-50V.

12. The method according to claim 6, wherein the channel comprises a conductive or semi-conductive two-dimensional material comprising one or more of graphene, reduced graphene oxide, a graphene-like material, and a transition metal dichalcogenide.

* * * * *